(12) United States Patent
Han

(10) Patent No.: US 10,319,762 B2
(45) Date of Patent: Jun. 11, 2019

(54) BACKSIDE ILLUMINATED CMOS IMAGE SENSOR AND METHOD OF MANUFACTURING THE SAME

(71) Applicant: DB HiTek Co., Ltd., Seoul (KR)

(72) Inventor: Chang-Hun Han, I-chen Si (KR)

(73) Assignee: DB HiTek Co., Ltd., Seoul (KR)

( * ) Notice: Subject to any disclaimer, the term of this patent is extended or adjusted under 35 U.S.C. 154(b) by 0 days.

(21) Appl. No.: 15/837,348

(22) Filed: Dec. 11, 2017

(65) Prior Publication Data
US 2019/0051689 A1 Feb. 14, 2019

(30) Foreign Application Priority Data

Aug. 14, 2017 (KR) ........................ 10-2017-0102856

(51) Int. Cl.
*H01L 27/146* (2006.01)
(52) U.S. Cl.
CPC .... *H01L 27/14623* (2013.01); *H01L 27/1464* (2013.01); *H01L 27/14685* (2013.01); *H01L 27/14621* (2013.01); *H01L 27/14627* (2013.01); *H01L 27/14645* (2013.01)

(58) Field of Classification Search
CPC .......... H01L 27/14623; H01L 27/1464; H01L 27/14685; H01L 27/14621; H01L 27/14627; H01L 27/14645; H01L 21/764
USPC ....................................................... 257/435
See application file for complete search history.

(56) References Cited

U.S. PATENT DOCUMENTS

2013/0037902 A1* 2/2013 Nakazawa ........ H01L 27/14623 257/432
2016/0276386 A1* 9/2016 Hsu .................. H01L 27/14623

* cited by examiner

*Primary Examiner* — Tu-Tu V Ho
(74) *Attorney, Agent, or Firm* — Andrew D. Fortney; Central California IP Group, P.C.

(57) ABSTRACT

The present invention relates to a backside illuminated CMOS image sensor.

18 Claims, 10 Drawing Sheets

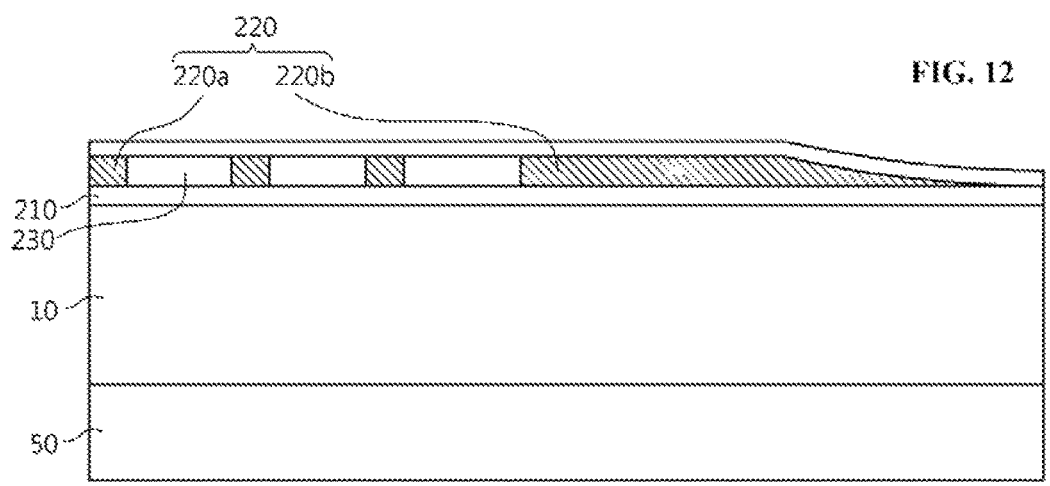
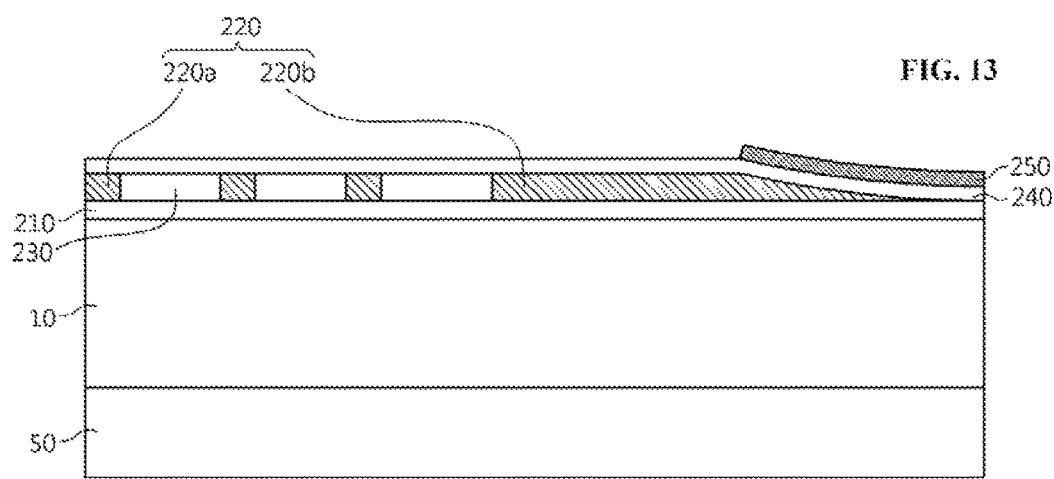

BACKSIDE ILLUMINATED CMOS IMAGE SENSOR AND METHOD OF MANUFACTURING THE SAME

CROSS-REFERENCE TO RELATED APPLICATION

This application claims priority to Korean Patent Application No. 10-2017-0102856, filed Aug. 14, 2017, the contents of which are incorporated herein by reference in its entirety.

TECHNICAL FIELD

The present invention relates to a backside illuminated CMOS image sensor.

BACKGROUND

An image sensor is a component of an imaging device generating an image in a cell phone camera or the like. Based on manufacturing processes and applications, the types of image sensors can be divided into a CCD (Charge Coupled Device) image sensor and a CMOS (Complementary Metal Oxide Semiconductor) image sensor. The CMOS image sensor is widely used as a general semiconductor chip manufacturing process due to its competitiveness in a high degree of integration, economy, and easiness in connecting with surrounding chips.

A conventional CMOS image sensor comprises a wiring part, a color filter part and a lens part stacked one after the other on a front surface of a silicon wafer. One problem of the image sensor having such structure is that reception of incident light by a light receiving element may decrease by metal wires inside the wiring part. Accordingly, what has appeared is a backside illuminated CMOS image sensor (BIS), in which a wiring part is disposed on a front surface of a substrate, and a color filter part and a lens part are disposed on a rear surface of the substrate.

FIG. 1 is a schematic plan view for describing a conventional backside illuminated CMOS image sensor. FIG. 2 is a cross-sectional view of the conventional image sensor, taken along A-A' of FIG. 1. FIGS. 3 and 4 are schematic expanded views for describing issues presented by a boundary between a pixel region and a surrounding region of the conventional image sensor. Below, the issues that exist in the conventional image sensor are described in detail with reference to FIGS. 1 to 4.

As shown in FIG. 1, the conventional backside illuminated CMOS image sensor comprises a pixel region P and a surrounding region S. The pixel region P is where light entering from the outside is received, and the surrounding region S is a shielding region.

Referring to FIG. 2, the conventional backside illuminated CMOS image sensor comprises: a semiconductor substrate 710; a plurality of light receiving elements (PD) 720 provided inside the substrate 710 in the pixel region P; a wiring part 740 disposed on a front surface 730 of the substrate 710, an insulating layer 760 disposed on a rear surface 750 of the substrate 710, and a color filter part 770 and a lens part 780 provided on a rear surface of the insulating layer 760.

The insulating layer 760 includes a first shielding metal 760a formed on the pixel region P, a lower insulating layer 760b forming the same layer as the first shielding metal 760a, a second shielding metal 760c formed on the surrounding region, and an upper insulating layer 760d forming an uppermost part.

In the conventional backside illuminated CMOS image sensor, since light is illuminated from the rear side it is difficult to shield light entering a circuit in the surrounding region S. Thus, to maximize shielding, it is common to form the first shielding metal 760a and the second shielding metal 760c at different heights as shown in FIG. 2 such that the insulating layer 760 is relatively thick. Using this method also prevents decrease in shielding effects in the surrounding region S caused by a dishing phenomenon occurring in a direction of moving away from the pixel region P during planarization of the second shielding metal 760c.

However, if the insulating layer 760 is constructed as above, the following problems occur. First, a height difference is created at a boundary between the first shielding metal 760a and the second shielding metal 760c. Then the upper insulating layer 760d becomes relatively thick as having to cover the thickness of the first and the second shielding metals 760a, 760b. In other words, the amount of light entering the light receiving element 720 disposed inside the substrate 710 in the pixel region P severely decreases.

Besides, referring to FIG. 3, if the thickness of the upper insulating layer 760d is made relatively small (or if the thickness of the upper insulating layer 760d becomes smaller than that of the first shielding metal 760a), a height difference is created at a boundary between the pixel region P and the surrounding S of the upper insulating layer 760d. Then the formation of the insulating layer 760 and the color filter part 770 becomes unstable, and the overall sensitivity unavoidably diminishes.

On the other hand, referring to FIG. 4, if the thickness of the upper insulating layer 760d is made thick, a refraction path of incident light inside the upper insulating layer 760d becomes relatively long. In that case, cross-talk between adjacent unit pixels occurs and the amount of light entering the light receiving element 720 inevitably decreases.

To address the abovementioned issues that the conventional backside illuminated CMOS image sensor has, the present invention is presented.

SUMMARY OF THE INVENTION

Technical Problems

The present invention has been made in an effort to solve the problems.

An object of the present invention is to provide a backside illuminated CMOS image sensor and a manufacturing method thereof, in which a first sub first shielding metal layer formed on a pixel region and a first sub second shielding metal layer formed on a surrounding region are formed at substantially the same height with substantially the same thickness such that a step difference is not created at a boundary between a pixel region and a surrounding region, thereby stably forming a color filter part and a lens part at the boundary.

Another object of the present invention is to provide a backside illuminated CMOS image sensor and a manufacturing method thereof, in which the overall thickness of an interlayer dielectric is reduced by forming the first sub first shielding metal layer and the first sub second shielding metal layer at substantially the same height, thereby minimizing a path of refraction of incident light to prevent cross-talk.

Yet another object of the present invention is to provide a backside illuminated CMOS image sensor and a manufacturing method thereof, in which the overall thickness of the interlayer dielectric is minimized to prevent decrease in light absorption by a light receiving element.

Yet another object of the present invention is to provide a backside illuminated CMOS image sensor and a manufacturing method thereof, provided additionally with a second shielding metal layer above a dishing surface created during a CMP process for planarizing a first shielding metal layer, thereby protecting a circuit inside a second shielding region from incident light.

Yet another object of the present invention is to provide a backside illuminated CMOS image sensor and a manufacturing method thereof, in which a second shielding metal layer is spaced a certain distance apart from an adjacent boundary between a pixel region and a surrounding region, such that the zone where a step difference occurs is spaced a certain distance apart from the boundary, thereby stably forming a color filter part and a lens part.

Yet another object of the present invention is to provide a backside illuminated CMOS image sensor and a manufacturing method thereof, in which a fourth insulating layer stacked on the second shielding metal layer becomes thicker in a direction of moving away from the pixel region by forming the upper and lower surfaces of the second shielding metal layer to slant downward along a direction of moving away from the pixel region, thereby planarizing the entire image sensor chip by providing thickness sufficient to prevent dishing.

Yet another object of the present invention is to provide a backside illuminated CMOS image sensor and a manufacturing method thereof, promoting economy and rapidity of operation by forming the second shielding metal layer by the same material as a pad during pad formation without a separate, extra process.

Technical Solutions

In order to achieve the above object, the present invention may be implemented by embodiments having the following features.

According to one embodiment of the present invention, a backside illuminated CMOS image sensor, comprising: a substrate having a front surface and a rear surface; an interlayer dielectric formed on the rear surface of the substrate and including an insulating layer and a shielding metal layer; a color filter part formed on the interlayer dielectric; a lens part formed on the color filter part; and a wiring part formed on the front surface of the substrate, wherein the interlayer dielectric comprises a first insulating layer formed on the rear surface of the substrate and a first shielding metal layer stacked on the first insulating layer for partly shielding incident light entering through the color filter part, wherein the first shielding metal layer comprises a first sub first shielding metal layer formed on a pixel region and a first sub second shielding metal layer formed on a surrounding region.

According to another embodiment of the present invention, the first sub second shielding metal layer of the backside illuminated CMOS image sensor of the present invention is formed at substantially the same height as the first sub first shielding metal layer with substantially the same thickness as the first sub first shielding metal layer.

According to yet another embodiment of the present invention, the interlayer dielectric further comprising: a second insulating layer formed between neighboring first sub first shielding metal layers spaced a distance apart in the pixel region; and a second shielding metal layer formed at one side above the first shielding metal layer.

According to yet another embodiment of the present invention, the second shielding metal layer is formed a certain distance apart from an adjacent boundary between the pixel region and the surrounding region.

According to yet another embodiment of the present invention, the second shielding metal layer is formed on a dishing surface of the first shielding metal layer and slanted downward along the dishing surface of the first shielding metal layer in a longitudinal direction.

According to yet another embodiment of the present invention, the second shielding metal layer is formed by the same material as a pad.

According to yet another embodiment of the present invention, the interlayer dielectric further comprising: a third interlayer dielectric formed on the first shielding metal layer or the second insulating layer; and a fourth insulating layer extending from the pixel region to the surrounding region in an uppermost part of the interlayer dielectric According to yet another embodiment of the present invention, the second shielding metal layer extends from an upper surface where dishing starts to occur in the first sub second shielding metal layer along a direction of moving away from the adjacent boundary between the pixel region and the surrounding region.

According to yet another embodiment of the present invention, a backside illuminated CMOS image sensor, comprising: a substrate having a front surface and a rear surface; an interlayer dielectric formed on the rear surface of the substrate and including an insulating layer and a shielding metal layer; a color filter part formed on the interlayer dielectric; a lens part formed on the color filter part; and a wiring part formed on the front surface of the substrate, wherein the interlayer dielectric comprises a first insulating layer formed on the rear surface of the substrate; a first shielding metal layer stacked on the first insulating layer for partly shielding incident light entering through the color filter part; and a second shielding metal layer formed at one side above the first shielding metal layer and having an upper surface and a lower surface formed to slant downward in the surrounding region along a dishing surface of the first shielding metal layer.

According to yet another embodiment of the present invention, the second shielding metal layer extends along the dishing surface of the first shielding metal layer to slant downward with a substantially uniform thickness.

According to yet another embodiment of the present invention, the second shielding metal layer is formed together with a bonding pad for wiring during a process of pad formation by the same material as the pad.

According to yet another embodiment of the present invention, the first shielding metal layer comprises a plurality of first sub first shielding metal layers formed apart from each other in a pixel region; and a first sub second shielding metal layer formed in a surrounding region at substantially the same height and with substantially the same thickness as the plurality of first sub first shielding metal layers.

According to yet another embodiment of the present invention, the interlayer dielectric further comprising: a second insulating layer formed between neighboring first sub first shielding metal layers of the plurality of first sub first shielding metal layers in the pixel region; a third insulating layer formed on the first shielding metal layer or the second insulating layer; and a fourth insulating layer formed on the first and the second shielding metal layers and having an upper surface flatly extending from the pixel region to the surrounding region.

According to one embodiment of the present invention, a method of manufacturing a backside illuminated CMOS image sensor, comprising: a step of forming a first shielding metal layer at a boundary between individual unit pixels and in a surrounding region on a rear surface of a first insulating layer; a step of forming a second shielding metal layer on a dishing surface of the first shielding metal layer; a step of depositing an upper insulating layer on the first and the second shielding metal layers; and a step of forming a color filter part and a lens part on the upper insulating layer.

According to another embodiment of the present invention, the step of forming the second shielding metal layer comprises a step of planarizing a rear surface of the first shielding metal layer previously deposited; and a step of forming the second shielding metal layer to extend on the dishing surface of the first shielding metal layer and slant downward along the dishing surface in a direction of moving away from a pixel region.

According to yet another embodiment of the present invention, the step of forming the second shielding metal layer is simultaneously performed with a process of forming a pad, wherein the second shielding metal layer is formed by the same material as the pad.

According to yet another embodiment of the present invention, the upper insulating layer is formed to extend in a direction of moving away from the pixel region such that an upper surface of the upper insulating layer is flat in the step of depositing the upper insulating layer.

According to yet another embodiment of the present invention a method for manufacturing a backside illuminated CMOS image sensor, comprising: a step of forming a first shielding metal layer on a rear surface of a first insulating layer; a step of forming a second shielding metal layer extending on a dishing surface of the first shielding metal layer in a direction of moving away from a pixel region with a substantially uniform thickness and with a downward slope along the dishing surface; a step of forming an upper insulating layer on the first and the second shielding metal layers; and a step of forming a color filter part and a lens part on a fourth insulating layer.

According to yet another embodiment of the present invention, the step of forming the first shielding metal layer comprises: a step of applying one or more photoresist films having a specific pattern to a second insulating layer deposited on the first insulating layer; a step of etching the second insulating layer exposed to the outside of a space between the photoresist films having the specific pattern; and a step of depositing the first shielding metal layer having a certain height between the second insulating layers forming a specific pattern and on the first insulating layer in a surrounding region.

According to yet another embodiment of the present invention, the second shielding metal layer is, preferably, spaced approximately 50 μm or more and 1,000 μm or less apart from an adjacent boundary of the pixel region.

Technical Effects

The present disclosure can obtain the following effects by the technical solutions described above.

According to the present invention, provided is a backside illuminated CMOS image sensor and a manufacturing method thereof, in which a first sub first shielding metal layer formed on a pixel region and a first sub second shielding metal layer formed on a surrounding region are formed at substantially the same height with substantially the same thickness such that a step difference is not created at a boundary between a pixel region and a surrounding region, thereby stably forming a color filter part and a lens part at the boundary.

Also, according to the present invention, provided is a backside illuminated CMOS image sensor and a manufacturing method thereof, in which the overall thickness of an interlayer dielectric is reduced by forming the first sub first shielding metal layer and the first sub second shielding metal layer at substantially the same height, thereby minimizing a path of refraction of incident light to prevent cross-talk.

In addition, according to the present invention, provided is a backside illuminated CMOS image sensor and a manufacturing method thereof, in which the overall thickness of the interlayer dielectric is minimized to prevent decrease in light absorption by a light receiving element.

In addition, according to the present invention, provided is a backside illuminated CMOS image sensor and a manufacturing method thereof, provided additionally with a second shielding metal layer above a dishing surface created during a CMP process for planarizing a first shielding metal layer, thereby protecting a circuit inside a second shielding region from incident light.

In addition, according to the present invention, provided is a backside illuminated CMOS image sensor and a manufacturing method thereof, in which a second shielding metal layer is spaced a certain distance apart from an adjacent boundary between a pixel region and a surrounding region, such that the zone where a step difference occurs is spaced a certain distance apart from the boundary, thereby stably forming a color filter part and a lens part.

Also, according to the present invention, provided is a backside illuminated CMOS image sensor and a manufacturing method thereof, in which a fourth insulating layer stacked on the second shielding metal layer becomes thicker in a direction of moving away from the pixel region by forming the upper and lower surfaces of the second shielding metal layer to slant downward along a direction of moving away from the pixel region, thereby planarizing the entire image sensor chip by providing thickness sufficient to prevent dishing.

Also, according to the present invention, provided is a backside illuminated CMOS image sensor and a manufacturing method thereof, promoting economy and rapidity of operation by forming the second shielding metal layer by the same material as a pad during pad formation without a separate, extra process.

BRIEF DESCRIPTION OF THE DRAWINGS

FIG. 12 is a schematic cross-sectional view for describing a step of depositing a third insulating layer of FIG. 7.

FIG. 13 is a schematic cross-sectional view for describing a step of forming a second shielding metal layer of FIG. 7;

DETAILED DESCRIPTION

Figure 1:
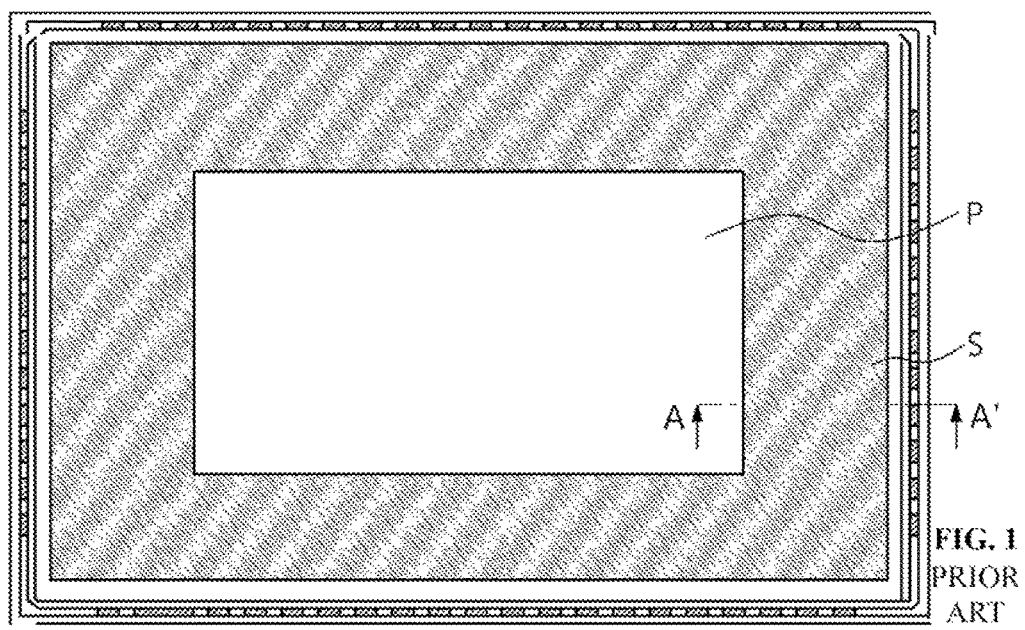
FIG. 1 is a schematic plan view for describing a conventional backside illuminated CMOS image sensor.
Figure 2:
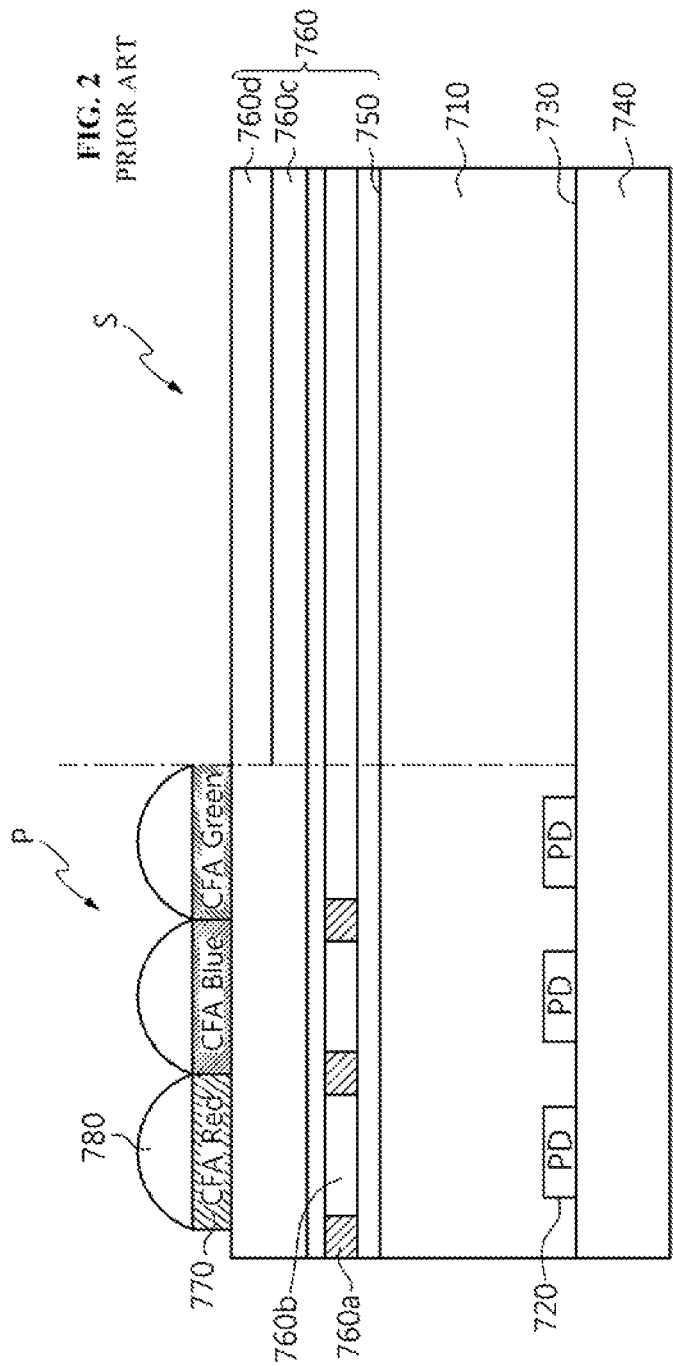
FIG. 2 is a cross-sectional view of the conventional image sensor, taken along A-A' of FIG. 1.
Figure 3:
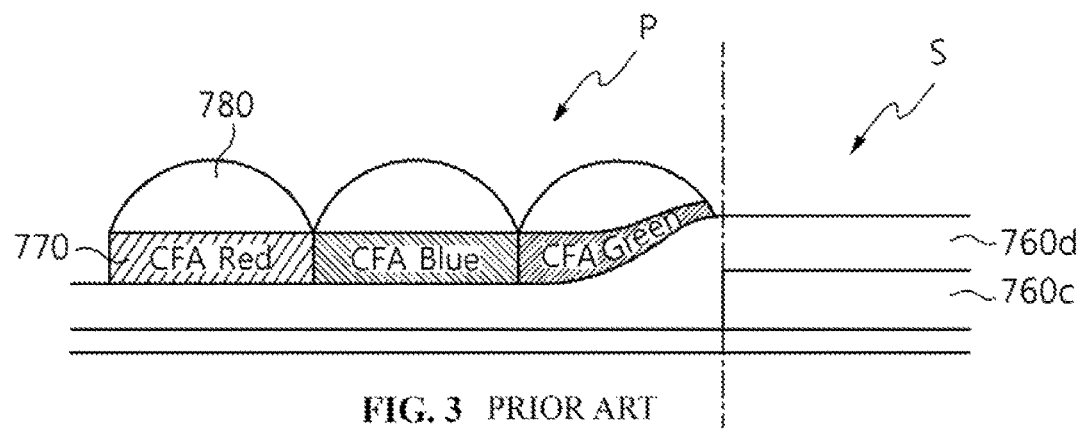
FIGS. 3 and 4 are schematic expanded views for describing issues presented by a boundary between a pixel region and a surrounding region of the conventional image sensor.
Figure 4:
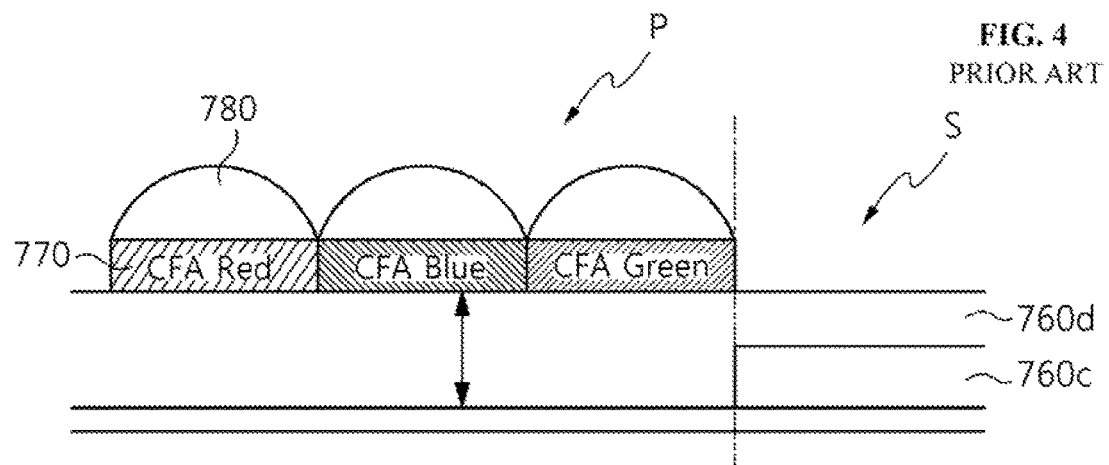

Hereinafter, embodiments of the present invention will be described in detail with reference to accompanying drawings. The embodiments of the present invention may be modified in various forms. The scope of the present invention should not be construed as limited to the embodiments set forth below but should be interpreted based on the appended claims. Also, these embodiments are provided for reference purpose so that this disclosure will fully convey the present invention to those skilled in the art.

It should be understood that when one constituent element is referred to as being disposed or located "on," "above," "at/in an upper side of," or "in an upper part of" another constituent element, one constituent element can be disposed in contact with an upper surface of another constituent element or can be disposed a certain distance apart from a layer of another constituent element. Also, when one constituent element is spaced apart from another constituent element, a different constituent element may be disposed between those constituent elements. In addition, when one constituent element is referred to as being disposed "directly on another constituent element" or "directly above," it should be noted that there are no intervening elements.

When one embodiment can be implemented differently, a function or an operation presented in a specific block may be carried out differently from the sequence described in a flowchart. For example, functions or operations of two blocks in succession may be performed substantially simultaneously or in reverse order.

According to the present invention, a backside illuminated CMOS image sensor 1 comprises a pixel region P and a surrounding region S. As described above, the pixel region P denotes a region which absorbs incident light entering from the outside, and the surrounding region S denotes a shielding region. Hereinafter, the surrounding region S in the image sensor 1 of the present invention is divided into a first shielding region S1 and a second shielding region S2 for description. The first shielding region S1 indicates a region capable of shielding incident light entering a surrounding circuit by a first shielding metal layer 220, and the second shielding region S2 indicates a region capable of shielding incident light entering the surrounding circuit by a second shielding metal layer 250 that is additionally formed above the first shielding metal layer 220 where dishing occurs, which will be described in more detail below.

In addition, the second shielding region S2 is formed generally at about 50 μm apart from a boundary of the adjacent pixel region P, preferably at about 50 μm or more and 1,000 μm or less. However, the second shielding region S2 does not need to begin to form at the above-mentioned distances, yet it is preferable that the second shielding region S2 begins to form at a point where dishing starts to occur in an upper part of a first sub second shielding metal layer 220*b* as described below. Accordingly, it is also preferable that the second shielding metal layer 250 begins to form at a point where dishing in the first sub second shielding metal layer 220*b* starts to occur.

From now on, described in detail is the backside illuminated CMOS image sensor 1 according to one embodiment of the present invention in reference to accompanying drawings.

Figure 5:
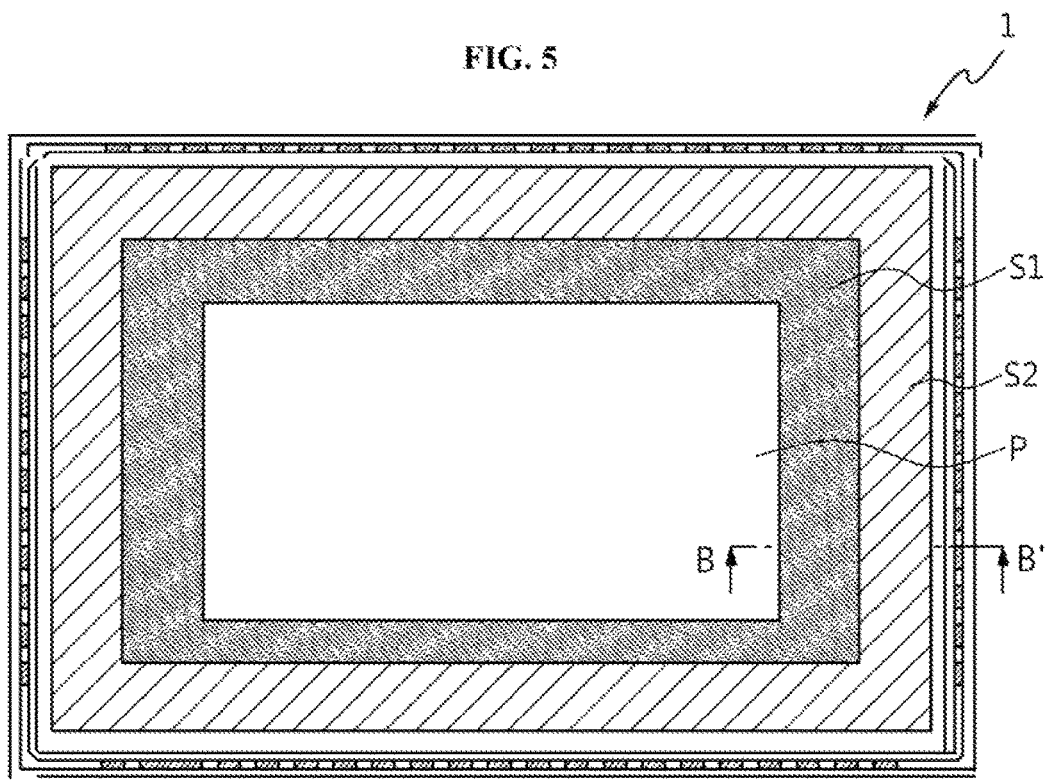
FIG. 5 shows a schematic plan view for illustrating a backside illuminated CMOS image sensor according to one embodiment of the present invention.
Figure 6:
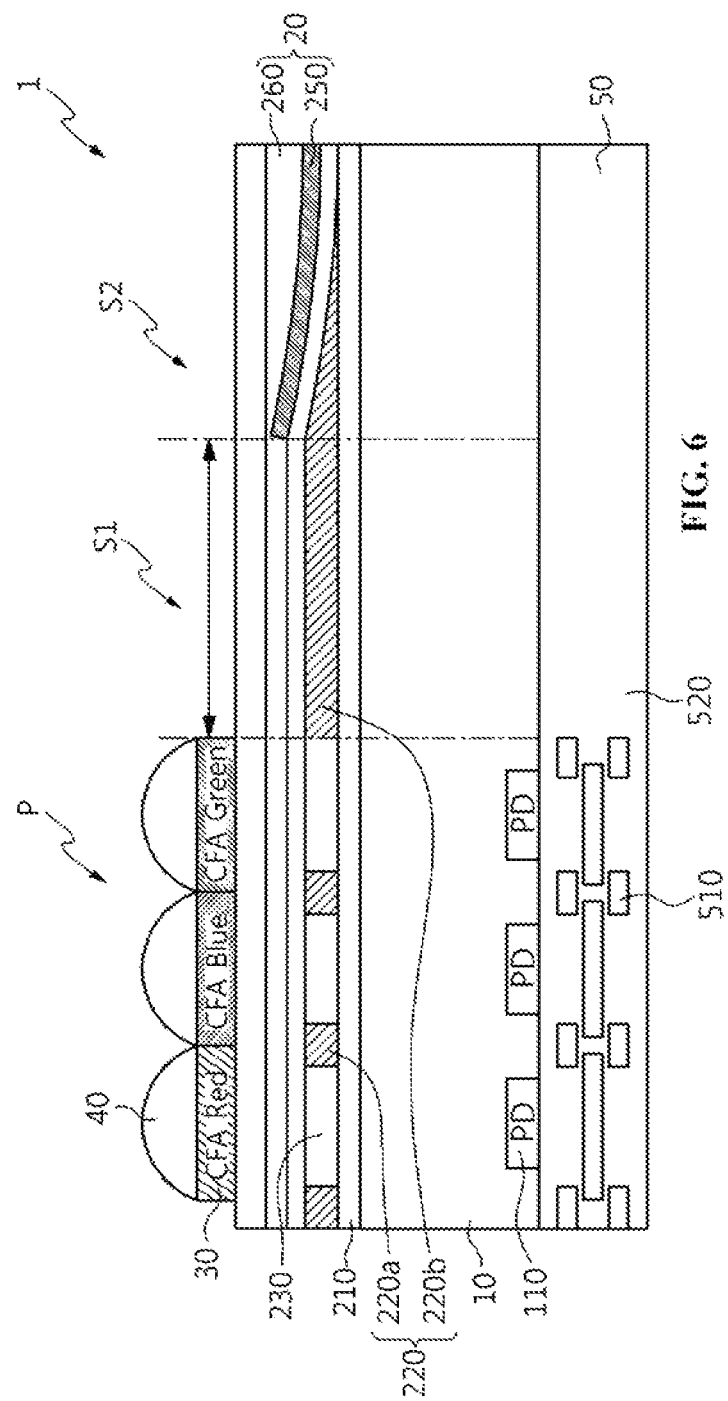
FIG. 6 shows a cross-sectional view of the image sensor, taken along line B-B' of FIG. 5.

FIG. 5 shows a schematic plan view for illustrating the backside illuminated CMOS image sensor according to one embodiment of the present invention, and FIG. 6 shows a cross-sectional view of the image sensor, taken along line B-B' of FIG. 5.

Referring to FIGS. 5 and 6, elements included in the backside illuminated CMOS image sensor 1 according to one embodiment of the present invention are described. According to the present invention, the image sensor 1 comprises: a substrate 10; an interlayer dielectric 20 formed on a rear surface of the substrate 10 and including an insulating layer and a shielding metal layer; a color filter part 30 formed on the interlayer dielectric 20; a lens part 40 formed on the color filter part 30; and a wiring part 50 disposed on a front surface of the substrate 10. According to the present invention, an area where a step difference occurs is moved by a certain distance from a boundary between a pixel region P and a surrounding region S. Accordingly, the present invention allows the color filter part 30 and the lens part 40 to be easily formed at the boundary of the pixel region P, thereby improving yield. In addition, the overall thickness of the interlayer dielectric 20 is minimized such that cross-talk due to reflection of light is prevented.

The substrate 10, for instance, may be an epitaxial substrate, a bulk substrate, or the like. One or more light receiving elements 110 and one or more transistors (not shown) electrically connected to the light receiving element 110 may be positioned in the pixel region P of the substrate 10.

The light receiving element 110 is an element which produces electrical charges in response to the incident light. The light receiving element 110 may be formed by a variety of any known or to-be-known elements, such as a photodiode, a photogate, and a phototransistor, and there are no particular limits.

The interlayer dielectric 20 is an element which includes a plurality of insulating layers stacked with each other and one or more shielding metal layers. To this end, the interlayer dielectric 20 may comprise a first insulating layer 210, a first shielding metal layer 220, a second insulating layer 230, a third insulating layer 240, a second shielding metal layer 250, and a fourth insulating layer 260.

Being formed on a rear surface of the substrate 10, the first insulating layer 210 is a protecting layer for protecting the substrate 10. The first insulating layer 210 may preferably have a function of preventing light scatter or reflection. For instance, the first insulating layer 210 may be formed as multilayer film in which materials with different indices of refraction are stacked. For instance, the first insulating layer 210 may be formed by a layered film where an oxide film and a nitride film are stacked or a layered film where an oxide film and a carbon-containing film (SiC) are stacked. However, the above-mentioned examples are intended only for describing the first insulating layer 210 in detail, and it should be noted that the scope of the present invention is not limited the above-mentioned examples.

The first shielding metal layer 220 is an element stacked on the first insulating layer 210 to shield the incident light entering through the color filter part 30 described later. To this end, the first shielding metal layer 220 may comprise a first sub first shielding metal layer 220*a* and a first sub second shielding metal layer 220*b*. Also, the first shielding metal layer 220 may be formed by various types of metals, including aluminum (Al), tungsten (W), and copper (Cu), and it should be noted that the scope of the present invention is not limited to a particular type. In order to minimize the dishing phenomenon which occurs during a CMP planarization process described later, it is common to deposit the first shielding metal layer 220 with a thickness of about 3,500 Å to 5,500 Å, preferably about 4,500 Å to 5,500 Å such that the thickness is to be about 1,500 Å to 2,500 Å, and preferably about 2,500 Å after the CMP planarization process. However, in this case, the overall thickness of the shielding metal layer 220 becomes excessively thick, which may cause the occurrence of cross-talk and decrease in light reception of the light receiving element 110, which will be later described in detail. Therefore, the thickness of the first shielding metal layer 220 formed on the first insulating layer 210 may preferably be formed to be about 2,000 Å to 3,500 Å before the planarization process.

The first sub first shielding metal layer 220*a* is positioned on the pixel region and is formed at each boundary between unit pixels to prevent cross-talk or data mix between adjacent unit pixels. For instance, a path of light entering through the color filter part 30 described later is formed above the first shielding metal layer 220 and may be directed to the adjacent unit pixel as it passes through one or more insulating layers having specific refractive index. In this case, cross-talk occurs between the adjacent unit pixels. Accordingly, it is preferable to form the first sub first shielding metal layer 220*a* at each boundary between unit pixels in order to prevent the occurrence of cross-talk between the adjacent unit pixels. The first sub first shielding metal layer 220*a* may be formed across the boundaries at both sides of the adjacent, individual unit pixels or only formed at the boundary of one side in the same direction. Thus, there is no limit thereto.

The first sub second shielding metal layer 220*b* is an element formed on the surrounding region S and shielding light directing at the inner circuit. The first sub second shielding metal layer 220*b* is characterized by being formed on the same layer as the first sub first shielding metal layer 220*a*. As described above, shielding metal layers formed in the pixel region P and the surrounding region S are generally prepared at different heights in the conventional image sensors, which creates a step difference at the boundary between the pixel region P and the surrounding region S. The step difference causes the interlayer dielectric to be thicker in general, which accompanies a possibility of decrease in light absorption of the light receiving element PD and increase in occurrence of cross-talk between neighboring unit pixels.

In addition, when an insulating film is formed on the step difference area of both shielding metal layers as in prior art, a step difference is created in the insulating film at the boundary between the unit pixel P and the surrounding region if the thickness of the insulating film is small. This causes the formation of the color filter part and the lens part to be unstable, thereby decreasing sensitivity. On the other hand, if the thickness of the insulating film is large, light absorption by the light receiving element PD decreases. In addition, cross-talk occurs and light absorption by the light receiving element PD within each unit pixel decreases as a path along which the light transmitting the insulating film refracts becomes relatively long.

To avoid such problems, the shielding metal layer 220 comprises: the first sub first shielding metal layer 220*a* and the first sub second shielding metal layer 220*b*, and the first sub first shielding metal layer 220*a* and the first sub second shielding 220*b* are formed in the same layer or at the same height. Accordingly, a step difference at the boundary between the shielding metal layers 220*a*, 220*b* can be prevented. According to the present invention, the overall thickness of the interlayer dielectric 20 is reduced compared to the prior art, so the thickness of the first shielding metal layer 220 can be made larger than in the conventional image sensor within a reasonable range. Hence, light screen factor increases, thereby reducing possibility of cross talk between adjacent pixels and better protecting the circuit in the surrounding region S. Also, sensitivity is improved as the color filter part 30 and the lens part 40 can be readily formed around the boundary between the pixel region P and the surrounding region S.

The second insulating layer 230 is an element formed between adjacent first sub first shielding metal layers 220*a* spaced apart from each other in the pixel region. For instance, the second insulating layer 230 may be a silicon oxide film, silicon nitride film or silicon oxynitride film. As described above, the first sub first shielding metal layer 220*a* and the first sub second shielding metal layer 220*b* are formed to have substantially the same thickness at substantially the same height. Accordingly, the second insulating layer 230 is not necessarily formed in the surrounding region S, which can reduce the overall thickness of the interlayer dielectric 20 to the thickness of the second insulating layer 230.

The third insulating layer 240 is an element formed on the first shielding metal layer 220 and/or the second shielding metal layer 230. The third insulating layer 240 extends from the pixel region P to the surrounding region S. The third insulating layer 240 may be, for example, a silicon oxide film, silicon nitride film or silicon oxynitride film. Moreover, the third insulating layer 240 is not an essential constituent element for the image sensor 1 according to the present invention, so it should be noted that only the fourth insulating layer 260 described later may be provided.

The second shielding metal layer 250 is formed on the first shielding metal layer 220 and, more preferably, formed above the first sub second shielding metal layer 220*b* of the second shielding region S2 to shield incident light and protect the circuit in the second shielding region S2. In general, chemical mechanical planarization (CMP) is performed to flatten the shielding metal layers. The CMP process allows flattening of the subject layer, but dishing occurs if the subject layer does not have sufficient thickness for planarization. Furthermore, it is not simple to form the first shielding metal layer 220 having a thickness exceeding a certain level due to several reasons stated above.

Therefore, dishing occurs in the first sub second shielding metal layer 220*b* described above with increasing distance from the pixel region P. Thus, it is possible that the first sub second shielding metal layer 220*b* does not have a thickness sufficient to perform its main function, shielding.

As stated above, the second shielding region S2 indicates a region starting from a portion where dishing starts to occur in the first sub second shielding metal layer 220*b* and further formed as the portion advances away from the pixel region P. It is necessary to have an element having extra shielding functions in order to protect the circuit inside the second shielding region S2 from light. The image sensor 1 according to the present invention provides a solution to the above-mentioned problems by forming the second shielding metal layer 250 in the second shielding region S2 and, more specifically, on the first shielding metal layer 220 of the second shielding region S2.

Like the first shielding metal layer 220, it is preferable to form the second shielding metal layer 250 to have a thickness of about 2,000□ or more and 3,500□ or less. It should be noted that the thickness of the second shielding metal layer 250 according to the present invention is not limited to the above exemplary ranges, however.

Thus, the second shielding metal layer 250 is separately formed in a part where dishing occurs in the first shielding metal layer 220, thereby fully protecting from incident light cast on the circuit inside the second shielding region S2. Likewise, a step difference is created between the first shielding region S1 and the second shielding region S2 as the second shielding metal layer 250 is formed in the second shielding region S2. In the conventional image sensor, a step difference is present between the pixel region P and the surrounding region S. On the other hand, according to the present invention, a zone where a step difference occurs is moved as farther as possible from the pixel region, which provides abovementioned effects, such as increase in sensitivity arisen by simple formation of the color filter part 30 and the lens part 40. As described above, the zone where the step difference occurs or the zone where the second shielding region S2 appears is generally spaced approximately 50 μm or more, preferably 50 μm to 1,000 μm, apart from the adjacent boundary with the pixel region P. However, the distance between the second shielding region S2 and the pixel region P is not limited to the above-mentioned illustrated range. It should also be noted that the distance may differ depending on the distance between the zone where dishing occurs in the first sub second shielding metal layer 220b and the adjacent boundary with the pixel region P.

In addition, since the second shielding metal layer 250 is formed above the zone where dishing occurs in the first shielding metal layer 220, it is preferable to form both upper and lower sides of the second shielding metal layer 250 to incline along a dishing profile as the second shielding metal layer 250 extends in a longitudinal direction. If both of the upper and lower sides of the second shielding metal layer 250 are not slanted, i.e., only the lower side is slanted, yet the upper side is made flat, the overall thickness of the second shielding metal layer 250 becomes thick with increasing distance from the pixel region P, which causes the overall thickness of the interlayer dielectric 20 to be larger. Then this results in decrease in light absorption by the light receiving element 110 as described above. To solve this problem, assume that a fourth insulating layer 260 formed on the second shielding metal layer 250, which will be described later, is prepared to have a small thickness in order to reduce the overall thickness of the interlayer dielectric 20. In this case, dishing also occurs during the CMP process for planarizing the fourth insulating layer 260, which will be discussed in detail below. Therefore, it is preferable to form both of the upper and lower sides of the second shielding metal layer 250 to slant downward along the dishing profile of the first shielding metal layer 220. Moreover, it is more preferable to keep substantially constant the thickness of the second shielding metal layer 250 as the second shielding metal extends in the longitudinal direction.

Since the second shielding metal layer 250 is formed together with a pad (a bonding pad for wiring) during pad formation, which is not shown in the drawings, a separate, additional process designed only for the second shielding metal layer 250 is not required. Hence, along with the promotion of the economic efficiency, the image sensor 1 may be manufactured relatively simply. Therefore, it is preferable to form the second shielding metal layer 250 from the same material as the pad. For instance, the second shielding metal layer 250 may be made by aluminum (Al), but the scope of the present invention is not limited to the example.

The fourth insulating layer 260 forms a top part of the interlayer dielectric 20 and extends from the pixel region P to the surrounding region S. For instance, the fourth insulating layer 260 may be a silicon oxide film, silicon nitride film or silicon oxynitride film. As described above, the conventional image sensor has a height difference at the boundary between the pixel region P and the surrounding region S. Subsequently, the fourth insulating layer should have relatively large thickness at the side of pixel region P as having to cover the first shielding metal layer and the second shielding metal layer both, formed in different layers from each other. However, the fourth insulating layer 260 according to the present invention covers the first shielding metal layer 220 and the second shielding metal layer 250 formed in the same layer, thereby enabling the thickness of the fourth insulating layer 260 to be relatively small. Thus, according to the present invention, the occurrence of crosstalk and decrease in light absorption of the light receiving element 110 can be prevented.

As described above, the second shielding metal layer 250 has approximately constant thickness in a longitudinal direction. The upper and lower sides of the second shielding metal layer 250 are slanted along the dishing surface of the first shielding metal layer 220. Thus, the thickness of the fourth insulating layer 260 formed in the second shielding region S2 becomes relatively large with increasing distance from the pixel region P in the second shielding region S2. Therefore, dishing can be minimized since sufficient thickness for planarization is imparted to the fourth insulating layer 260 during CMP processing for the fourth insulating layer 260. That is, it is assured that the entire chip is thoroughly planarized.

The color filter part 30 is formed on the interlayer dielectric 20 in the pixel region. Only a necessary color is selected by corresponding color filters (R, G, B) of the color filter part 30 from the incident light entering through the lens part 40, which will be described later. Also, the color selected enters the light receiving element 110 of a corresponding pixel. As described above, since height difference is not created at the boundary of the pixel region P, the color filter part 30 can be easily constructed from the central area to the entire boundary of the pixel region P.

The lens part 40 is formed on the color filter part 30 and includes a plurality of microlenses which focus incident light entering from the rear side of the substrate 10 on the light receiving element 110 within its corresponding pixel.

The wiring part 50 is formed at a front side of the substrate 10 and may include a metal wiring layer 510 and a lower insulating layer 520.

The metal wiring layer 510 is formed, for instance, by a single metal or an alloy layer in which two or more types of metals are mixed. The metal wiring layer 510 may preferably be made by aluminum. The lower insulating layer 520 is formed by insulating material, such as silicon oxide. It is desirable to form multilayered wires by repeatedly layering the metal wiring layer 510 and the lower insulating layer 520. The multilayered wires may be connected with wires on a different layer, respectively, by contact. A contact plug may be formed through a damascene process inside the relevant lower insulating layer 520. The contact plug may be formed by conductive material, selected from, for instance, a polycrystalline silicon film doped with an impurity ion, a metal, or an alloy film where at least two or more types of metals are mixed, such that the wiring layers layered above and below are electrically connected with each other. The lower insulating layer 520 is formed by any one of oxide films selected from BPSG, PSG, BSG, USG, TEOS or HDP or a layered film where two or more of the oxide films are layered. Furthermore, the lower insulating layer 520 may be planarized by the CMP process after deposition.

Below described in detail is a method S1 for forming a backside illuminated CMOS image sensor according to one embodiment of the present invention.

Figure 7:
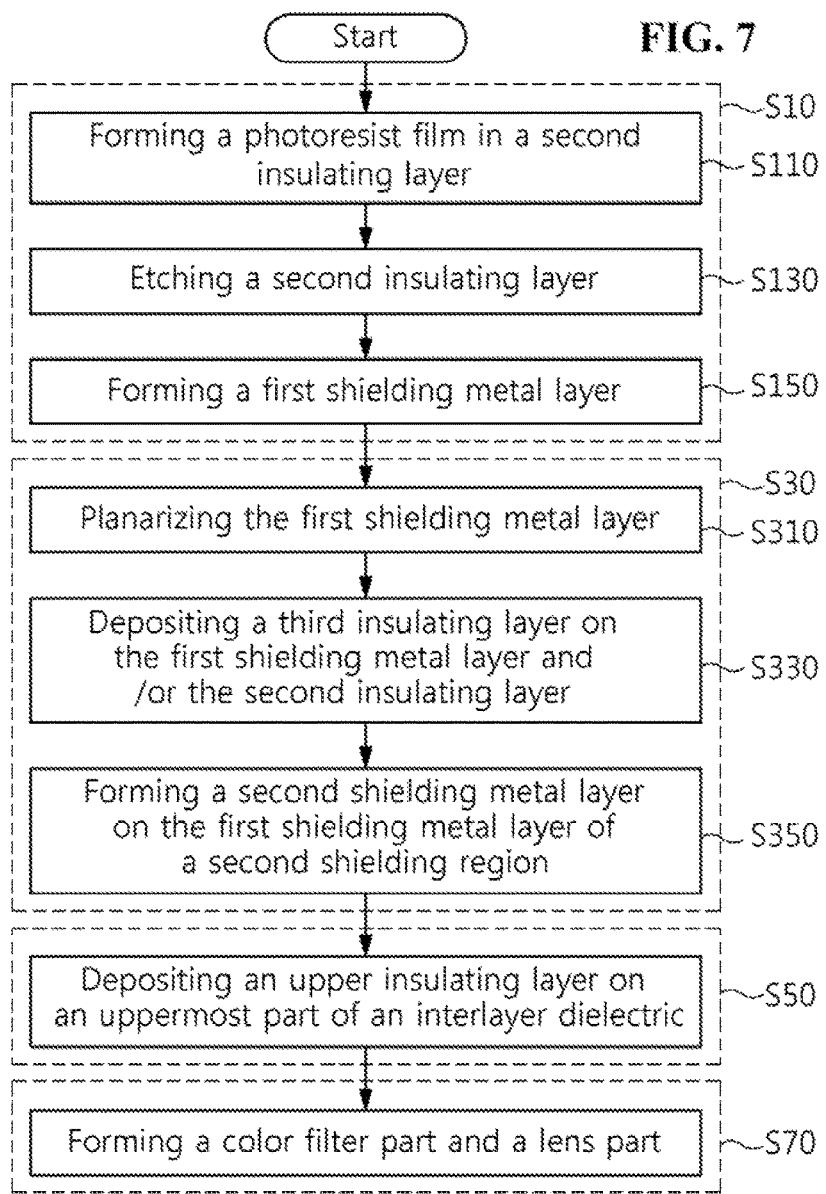
FIG. 7 is a block diagram showing a method for manufacturing an image sensor according to one embodiment of the present invention.

FIG. 7 is a block diagram showing the method for forming an image sensor according to one embodiment of the present invention.

Referring to FIG. 7, a process occurring after completion of forming a substrate 10, first and second insulating layers 210, 230 of an interlayer dielectric 20, and a wiring part 50 will be explained in detail for the method S1 for forming the backside illuminated CMOS image sensor according to one embodiment of the present invention.

The method S1 for forming a backside illuminated CMOS image sensor according to one embodiment of the present invention comprises: a step of forming a first shielding metal layer 220 on a rear surface of a substrate 10, particularly on a rear surface of a first insulating layer 210; a step S30 of forming a second shielding metal layer 250 on the first shielding metal layer 220 in a second shielding region S2; a step S50 of depositing an upper insulating layer (a fourth insulating layer, 260) on the first and the second shielding metal layers 220, 250; and a step S70 of forming a color filter part 30 and a lens part 40 on the upper insulating layer 260 in the pixel region P.

Figure 8:
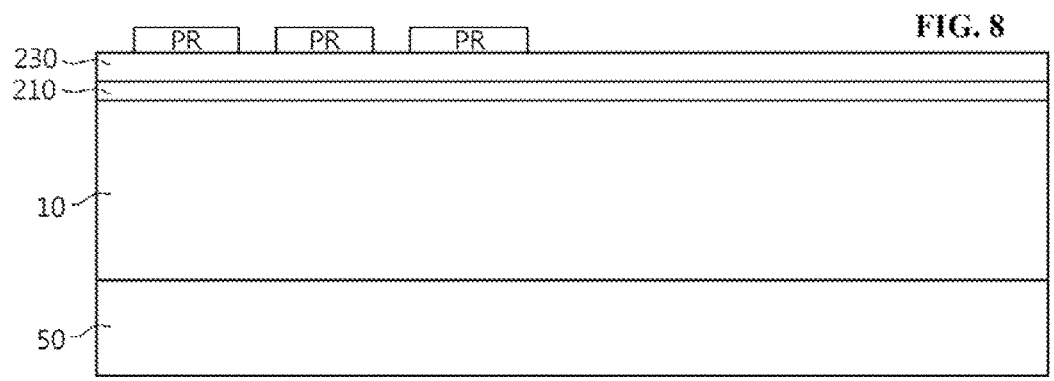
FIG. 8 is a schematic cross-sectional view for illustrating a step of forming a photoresist film of FIG. 7.
Figure 9:
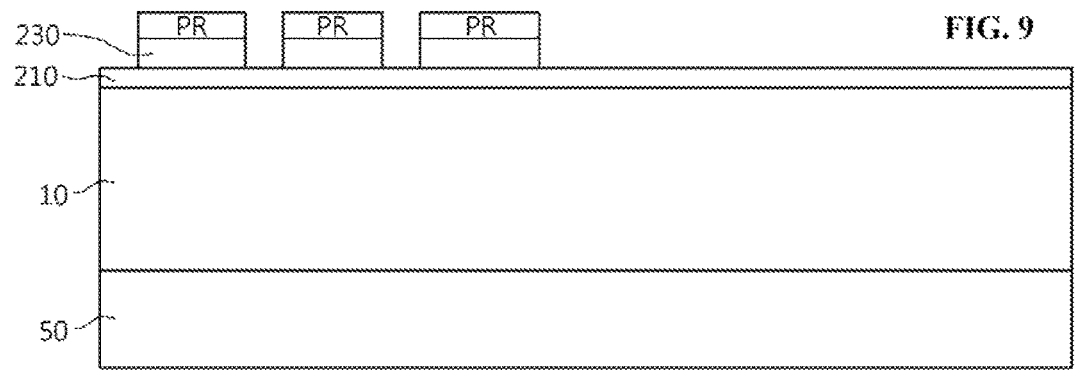
FIG. 9 is a schematic cross-sectional view for illustrating a step of etching a second insulating film of FIG. 7.

FIG. 8 is a schematic cross-sectional view for illustrating a step of forming a photoresist film of FIG. 7; FIG. 9 is a schematic cross-sectional view for illustrating a step of etching a second insulating film of FIG. 7; and FIG. 10 is a schematic cross-sectional view for illustrating a step of depositing the first shielding metal layer of FIG. 7.

Figure 10:
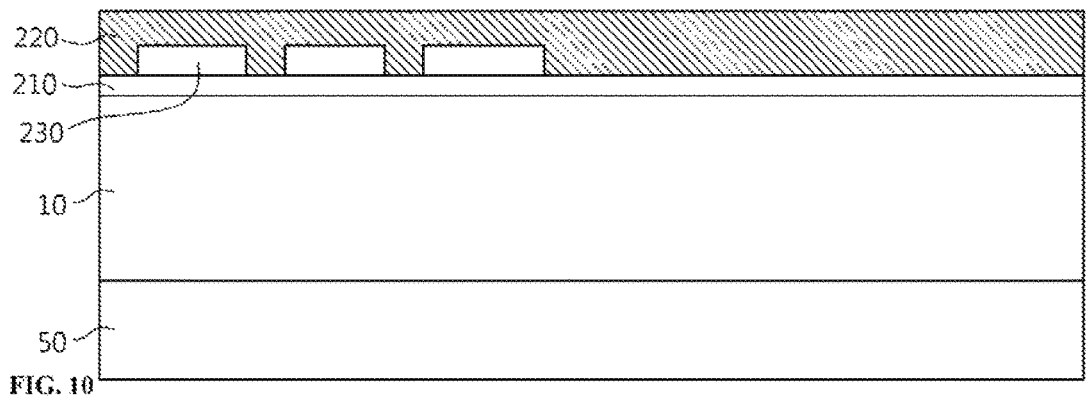
FIG. 10 is a schematic cross-sectional view for illustrating a step of depositing a first shielding metal layer of FIG. 7.

Referring to FIGS. 8 to 10, the step S10 of forming the first shielding metal layer includes a step S110 of forming a photoresist film; a step S130 of etching a second insulating layer; and a step S150 of forming a first shielding metal layer.

Referring to FIG. 8, the step S110 for forming the photoresist film is a step where a photoresist being a high molecular compound having photosensitivity, adhesive property, and resistance to corrosion is applied to a second insulating layer 230 deposited on the first insulating layer 210 and then dried. After the photoresist film is applied to the second insulating layer 230, if light is illuminated after a photomask (not shown) is placed between a light source and the second insulating layer 230, a photoresist film with a specific pattern is created. The pattern is formed identically with the second insulating layer 230 which is to be formed in a space between the first sub first shielding metal layers 220 spaced from each other.

Referring to FIG. 9, the step S130 for etching the second insulating layer is a step for etching the second insulating layer 230 exposed to the outside in the space between the photoresist films with the specific patterns. The etching process may be a dry etching process or a wet etching process using chemicals. For instance, the etching process through the step S130 of etching the second insulating layer may be a reactive ion etching (RIE) process, one example of the dry etching process. However, the scope of the present invention is not limited to the examples presented above.

Referring to FIG. 10, the step S150 of forming the first shielding metal layer is a step where a first shielding metal layer 220 is formed on the second insulating layer 230 which forms a specific pattern and in the surrounding region. The thickness of the first shielding metal layer 230 is, preferably, approximately 2,000□ or more and 3,500□ or less. Moreover, the first shielding metal layer 230 may be formed by various types of metals, such as aluminum (Al) and tungsten (W). Subsequently, a step S30 of forming a second shielding metal layer is performed.

Figure 11:
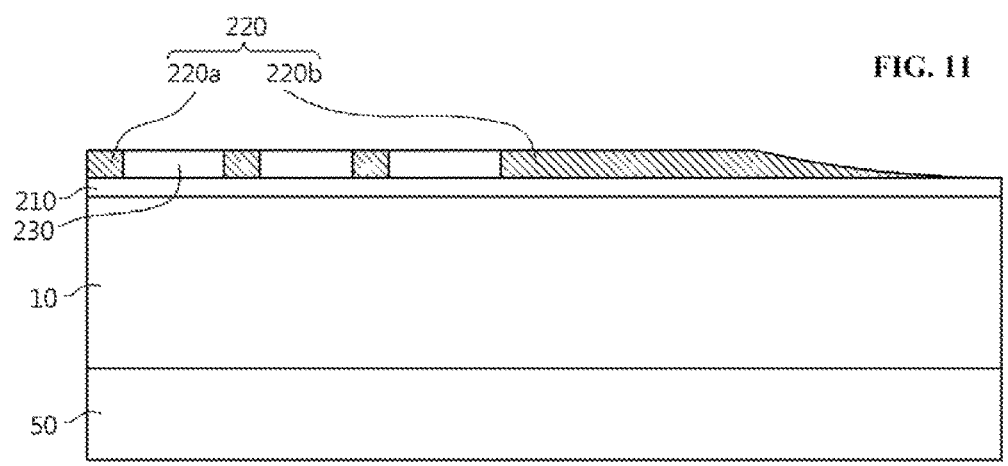
FIG. 11 is a schematic cross-sectional view for describing the step of planarizing a first shielding metal layer of FIG. 7.
Figure 14:
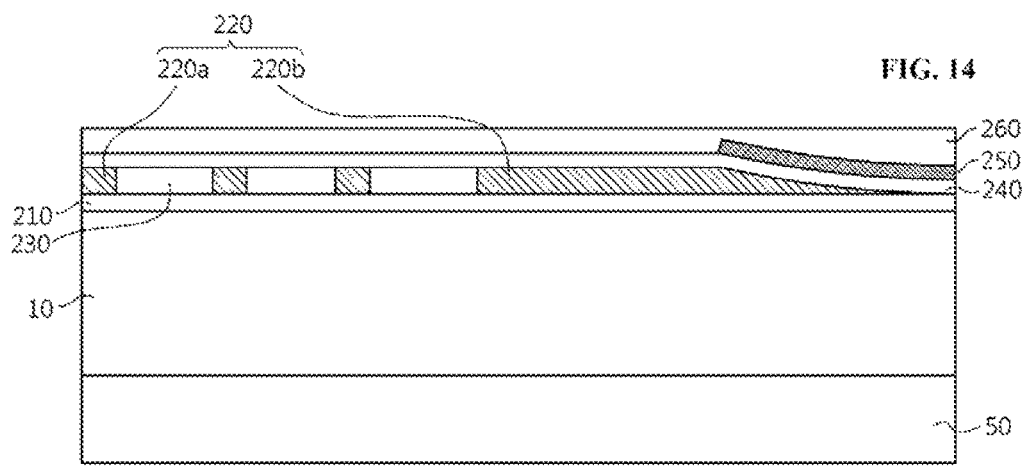
FIG. 14 is a schematic cross-sectional view for describing a step of depositing an upper insulating layer of FIG. 7.

FIG. 11 is a schematic cross-sectional view for describing the step of planarizing the first shielding metal layer of FIG. 7. FIG. 12 is a schematic cross-sectional view for describing a step of depositing a third insulating layer of FIG. 7. FIG. 13 is a schematic cross-sectional view for describing a step of forming a second shielding metal layer of FIG. 7. FIG. 14 is a schematic cross-sectional view for describing a step of depositing an upper insulating layer of FIG. 7.

Referring to FIGS. 11 to 14, the step S30 of forming the second shielding metal layer may comprise: a step S310 of planarizing a first shielding metal layer, a step S330 of depositing a third insulating layer, a step S350 of forming a second shielding metal layer, and a step S370 of depositing an upper insulating layer.

Referring to FIG. 11, the step S310 of planarizing the first shielding metal layer is to perform a process for planarizing a rear surface of the first shielding metal layer 220 already deposited. For example, the CMP process may be used to planarize the rear surface of the first shielding metal layer 220. As described above, dishing arises at a side (the second shielding region) spaced a certain distance apart from the pixel region P of the first shielding metal layer 230 when CMP is carried out. That is, the first shielding region S1 and the second shielding region S2 may be separated through the step S310 of planarizing the first shielding metal layer. The location where dishing occurs is spaced approximately 50 μm or more apart from the adjacent boundary of the pixel region P and preferably 50 μm or more and 1,000 μm or less.

Referring to FIG. 12, the step S330 of depositing the third insulating layer is to deposit the third insulating layer 240 on the first shielding metal layer 220 and/or the second insulating layer 230. As described above, the third insulating layer 240 may be, for instance, a silicon oxide film, silicon nitride film or silicon oxynitride film. In addition, it should be noted that the step S350 of forming a second shielding metal layer, described below, may be carried out after the step S310 of planarizing the first shielding metal layer without performing the step S330 of depositing the third insulating layer.

Referring to FIG. 13, the step S350 of forming the second shielding metal layer is to form the second shielding metal layer 250 on the first shielding metal layer 220 along a direction of moving away from the pixel region P in the second shielding region S2. Accordingly, an additional shielding metal layer is formed in the first shielding metal layer 220 where dishing occurs and provides protection for the circuit inside the second shielding region S2. Preferably, the second shielding metal layer 250, as described above, is formed to slant downward along the dishing surface of the first shielding metal layer 220 while having approximately uniform thickness in the longitudinal direction.

In addition, it is preferable not to perform a separate, additional process for forming the second shielding metal layer 250 by performing the step S350 of the second shielding metal layer together with the pad formation process (not shown). That is, during the pad formation process, the second shielding metal layer 250 is formed together with the pad. Thus, it is preferable to form the second shielding metal layer 250 by the same material as the pad. For instance, the second shielding metal layer 250 may be formed by aluminum.

Referring to FIG. 14, the step S50 of depositing the upper insulating layer is to form an upper insulating layer (the fourth insulating layer 260) on top of the interlayer dielectric 20. As described above, the fourth insulating layer 260 may be a silicon oxide film, silicon nitride film or silicon oxynitride film, for example. As illustrated above, the thickness of the fourth insulating layer 260 through the step S50 of depositing the fourth insulating layer may be made small. Accordingly, occurrence of cross-talk and decrease in light absorption by the light receiving element 110 may be avoided. Furthermore, the second shielding metal layer 250 has approximately uniform thickness in the longitudinal direction and its upper and lower sides both are slanted downward along the dishing surface of the first shielding metal layer 220. Thus, the thickness of the fourth insulating layer 260, the upper surface of which is formed approximately (or substantially) flatly in the second shielding region S2, becomes relatively thick in a direction of moving away from the pixel region P. As a result, the thickness required to minimize the occurrence of dishing in the CMP process for planarizing the fourth insulating layer 260 is obtained, thereby ensuring the planarization of the entire chip of the image sensor 1.

Figure 15:
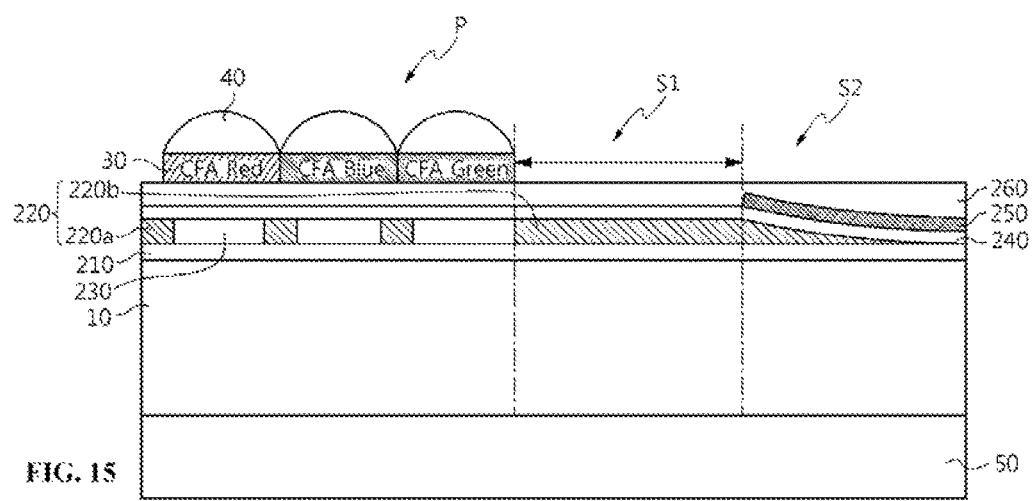
FIG. 15 is a schematic cross-sectional view for describing a step of forming a color filter layer and a lens part.

FIG. 15 is a schematic cross-sectional view for describing the step of forming the color filter layer and the lens part according to FIG. 7.

Referring to FIG. 15, in the step S70 of forming the color filter part 30 and the lens part 40, the color filter part 30 is formed on the fourth insulating layer 260 of the pixel region P through a general process and, subsequently, the lens part 40 is formed on the color filter part 30. After the formation of the color filter part 30 and before the formation of the lens part 40, a planarization layer (not shown) may additionally be formed. Also, after the formation of the lens part 40, a separate process designed to remove residual material on the surface may be performed.

The foregoing description of the invention illustrates the present invention. Additionally, the disclosure shows and describes only the preferred embodiments of the present invention, but as aforementioned, it is to be understood that the invention is capable of use in various other combinations, modifications, and environments. The invention is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable the various modifications required by the particular applications or uses of the invention. Accordingly, the description is not intended to limit the invention to the form disclosed herein.

REFERENCE NUMERALS

1: backside illuminated CMOS image sensor
10: substrate
110: light receiving element
20: interlayer dielectric
210: first insulating layer
220: first shielding metal layer
220a: first sub first shielding metal layer
220b: first sub second shielding metal layer
230: second insulating layer
240: third insulating layer
250: second shielding metal layer
260: fourth insulating layer
30: color filter part
40: lens part
50: wiring part
510: metal wiring layer
520: lower insulating layer
S1: method for forming a backside illuminated CMOS image sensor
S10: step of forming a first shielding metal layer
S110: step of forming a photoresist film
S130: step of etching a second insulating layer
S150: step of depositing a first shielding metal layer
S30: step of forming a second shielding metal layer
S310: step of planarizing a first shielding metal layer
S330: step of depositing an insulating layer
S350: step of forming a second shielding metal layer
S50: step of depositing an upper insulating layer
S70: step of forming a color filter layer and a lens part

The invention claimed is:

1. A backside illuminated CMOS image sensor, comprising:
a substrate having a front surface and a rear surface;
an interlayer dielectric on the rear surface of the substrate and including an insulating layer and a shielding metal layer;
a color filter part on the interlayer dielectric;
a lens part on the color filter part; and
a wiring part on the front surface of the substrate,
wherein the interlayer dielectric comprises:
a first insulating layer on the rear surface of the substrate;
a first shielding metal layer on the first insulating layer for partly shielding incident light entering through the color filter part,
wherein the first shielding metal layer comprises a first sub first shielding metal layer on a pixel region and a first sub second shielding metal layer on a surrounding region,
a second insulating layer between neighboring first sub first shielding metal layers spaced a distance apart in the pixel region, and
a second shielding metal layer at one side above the first shielding metal layer.

2. The backside illuminated CMOS image sensor of claim 1, wherein the first sub second shielding metal layer is at substantially the same height as the first sub first shielding metal layer, and has substantially a same thickness as the first sub first shielding metal layer.

3. The backside illuminated CMOS image sensor of 1, wherein the second shielding metal layer is a certain distance apart from an adjacent boundary between the pixel region and the surrounding region.

4. The backside illuminated CMOS image sensor of claim 3, wherein the second shielding metal layer is formed on a dishing surface of the first shielding metal layer and slanted downward along the dishing surface of the first shielding metal layer in a longitudinal direction.

5. The backside illuminated CMOS image sensor of claim 3, wherein the second shielding metal layer comprises a same material as a wire bonding pad.

6. The backside illuminated CMOS image sensor of claim 4, wherein the interlayer dielectric further comprising:
a third interlayer dielectric formed on the first shielding metal layer or the second insulating layer; and
a fourth insulating layer extending from the pixel region to the surrounding region in an uppermost part of the interlayer dielectric such that the upper surface of the fourth insulating layer is flat.

7. The backside illuminated CMOS image sensor of claim 6, wherein the second shielding metal layer extends from an upper surface where dishing starts to occur in the first sub second shielding metal layer along a direction of moving away from the adjacent boundary between the pixel region and the surrounding region.

8. A backside illuminated CMOS image sensor, comprising:
a substrate having a front surface and a rear surface;
an interlayer dielectric formed on the rear surface of the substrate and including an insulating layer and a shielding metal layer;
a color filter part formed on the interlayer dielectric;
a lens part formed on the color filter part; and
a wiring part formed on the front surface of the substrate,
wherein the interlayer dielectric comprises a first insulating layer formed on the rear surface of the substrate; a first shielding metal layer stacked on the first insulating layer for partly shielding incident light entering through the color filter part; and a second shielding metal layer formed at one side above the first shielding metal layer and having an upper surface and a lower surface formed to slant downward in the surrounding region along a dishing surface of the first shielding metal layer.

9. The backside illuminated CMOS image sensor of claim 8, wherein the second shielding metal layer extends along the dishing surface of the first shielding metal layer to slant downward with a substantially uniform thickness.

10. The backside illuminated CMOS image sensor of claim 8, wherein the second shielding metal layer is formed together with a bonding pad for wiring during a process of pad formation by the same material as the bonding pad.

11. The backside illuminated image sensor of claim 8, wherein the first shielding metal layer comprises:
a plurality of first sub first shielding metal layers formed apart from each other in a pixel region; and
a first sub second shielding metal layer formed in a surrounding region at substantially the same height and with substantially the same thickness as the plurality of first sub first shielding metal layers.

12. The backside illuminated CMOS image sensor of claim 11, wherein the interlayer dielectric further comprising:
a second insulating layer formed between neighboring first sub first shielding metal layers of the plurality of first sub first shielding metal layers in the pixel region;
a third insulating layer formed on the first shielding metal layer or the second insulating layer; and
a fourth insulating layer formed on the first and the second shielding metal layers and having an upper surface flatly extending from the pixel region to the surrounding region.

13. A method of manufacturing a backside illuminated CMOS image sensor, comprising:
a step of forming a first shielding metal layer at a boundary between individual unit pixels and in a surrounding region on a rear surface of a first insulating layer;
a step of forming a second shielding metal layer on a dishing surface of the first shielding metal layer;
a step of depositing an upper insulating layer on the first and the second shielding metal layers; and
a step of forming a color filter part and a lens part on the upper insulating layer.

14. The method of manufacturing a backside illuminated CMOS image sensor of claim 13, wherein the step of forming the second shielding metal layer comprises:
a step of planarizing a rear surface of the first shielding metal layer previously deposited; and
a step of forming the second shielding metal layer to extend on the dishing surface of the first shielding metal layer and slant downward along the dishing surface in a direction of moving away from a pixel region.

15. The method of manufacturing a backside illuminated CMOS image sensor of claim 14, wherein the step of forming the second shielding metal layer is simultaneously performed with a process of forming a pad, wherein the second shielding metal layer is formed by the same material as the pad.

16. The method of manufacturing a backside illuminated CMOS image sensor of claim 15, wherein the upper insulating layer is formed to extend in a direction of moving away from the pixel region such that an upper surface of the upper insulating layer is flat in the step of depositing the upper insulating layer.

17. A method for manufacturing a backside illuminated CMOS image sensor, comprising:
a step of forming a first shielding metal layer on a rear surface of a first insulating layer;
a step of forming a second shielding metal layer extending on a dishing surface of the first shielding metal layer in a direction of moving away from a pixel region with a substantially uniform thickness and with a downward slope along the dishing surface;
a step of forming an upper insulating layer on the first and the second shielding metal layers; and
a step of forming a color filter part and a lens part on a fourth insulating layer.

18. The method for manufacturing a backside illuminated CMOS image sensor of claim 17, wherein the step of forming the first shielding metal layer comprises:
a step of applying one or more photoresist films having a specific pattern to a second insulating layer deposited on the first insulating layer;
a step of etching the second insulating layer exposed to the outside of a space between the photoresist films having the specific pattern; and
a step of depositing the first shielding metal layer having a certain height between the second insulating layers forming a specific pattern and on the first insulating layer in a surrounding region.

* * * * *